United States Patent [19]

Kondo et al.

[11] Patent Number: 5,089,222
[45] Date of Patent: Feb. 18, 1992

[54] MANUFACTURING PROCESS OF CHEVREL COMPOUNDS

[75] Inventors: Shigeo Kondo; Yasuharu Yamamura, both of Osaka, Japan

[73] Assignee: Matsushita Electric Industrial Co., Ltd., Japan

[21] Appl. No.: 570,079

[22] Filed: Aug. 20, 1990

Related U.S. Application Data

[62] Division of Ser. No. 369,556, Jun. 15, 1989, Pat. No. 4,966,749.

[30] Foreign Application Priority Data

Oct. 15, 1987 [JP] Japan ............................ 62-262120

[51] Int. Cl.$^5$ .................................................. B22F 7/00
[52] U.S. Cl. ......................................... 419/10; 419/57; 419/58
[58] Field of Search ........................... 419/10, 57, 58

[56] References Cited

U.S. PATENT DOCUMENTS

| 4,704,249 | 11/1987 | Glatzle | 419/4 |
| 4,808,488 | 2/1989 | Cheverl et al. | 428/614 |
| 4,966,749 | 10/1990 | Kondo et al. | 419/10 |

Primary Examiner—Stephen J. Lechert, Jr.
Attorney, Agent, or Firm—Lowe, Price, LeBlanc & Becker

[57] ABSTRACT

This invention relates to the manufacture of Chevrel compounds by sintering a mixture of metal sulfides, metallic molybdenum and molybdenum sulfides under reduced pressure or in a stream of an inert gas containing a reductive gas, and by sintering a mixture of metal sulfides and molybdenum sulfides in a stream of an inert gas containing a reductive gas. This process does not meet any complicated procedure as in prior art and enables one to use a reaction container a desired number of times and to prepare Chevrel compounds inexpensively in large amounts.

2 Claims, 3 Drawing Sheets

MANUFACTURING PROCESS OF CHEVREL COMPOUNDS

This is a division of application Ser. No. 07/369,556, filed Jun. 15, 1989, now U.S. Pat. No. 4,966,749.

TECHNICAL FIELD

This invention relates to a manufacturing process of chevrel phase compounds whose electric resistance in a temperature range of liquid helium becomes almost zero and which can be used as a material for a superconductor utilizable in the fields of high efficiency power storage, generation of intense magnetic fields and high efficiency power transmissions or as an electrode material for electrochemical elements.

TECHNICAL BACKGROUND

Since chevrel phase compounds have a critical temperature higher than a temperature of liquid helium and have a very high critical magnetic field, many studies have been made. Moreover, certain chevrel phase compounds such as, for example, copper chevrel phase compounds, wherein the metal element can be chemically or electrochemically released from or received in the compound without destroying the skeletal structure of $Mo_6S_8$ of the compound, have been studied for application as electrode materials of electrochemical elements. In a conventional process of manufacturing chevrel phase compounds, powders of various metal elements, metallic molybdenum powder and sulfur powder were mixed after milling, the mixture was placed in a quartz glass tube and sealed under reduced pressure, and sintered at 400° C. for 12 hours, then at 600° C. for 12 hours and finally at 1000° C. for 24 hours.

In this process, the starting materials contain sulfur which is apt to react with most metals and are sintered after placing in a reaction tube and sealing the tube under reduced pressure, so that it is necessary to use as the reactor tube, a quartz glass tube which is stable against sulfur and can be worked as desired. After the sintering, it is essential to open the quartz glass reaction tube in order to withdraw the resultant product, thus making it difficult to use the quartz glass reaction tube several times. In addition, if large amounts of the product are prepared in one batch, sulfur will be gasified during the course of temperature rise. When the pressure of the resultant gas becomes too high, the quartz glass reaction tube is broken. Thus, the production process is complicated and involves a problem in the industrial production of the compound.

DISCLOSURE OF THE INVENTION

The present invention provides a manufacturing process of chevrel phase compounds which is simple in procedure and is adapted for mass-production.

The above object of the invention is achieved by a process which comprising mixing a sulfide of a metal (which metal is at least one element selected from Li, Na, Mg, Ca, Sc, Cr, Mn, Fe, Co, Ni, Cu, Zn, Sr, Y, Pd, Ag, Cd, In, Sn, Ba, La, Pb, Ce, Pr, Nd, Sm, Eu, Gd, Tb, Dy, Ho, Er, Tm, Yb and Lu), metallic molybdenum and molybdenum sulfide, and sintering the mixture under reduced pressure or in a stream of an inert gas (argon, helium or nitrogen gas) containing a reductive gas.

BEST MODE OF CARRYING OUT THE INVENTION

The present invention is described by way of examples.

EXAMPLE 1

A copper chevrel phase compound, $Cu_2Mo_6S_8$ (100 g) was prepared in the following manner.

Cuprous sulfide powder (16.95 g), metallic molybdenum powder (25.00 g) and molybdenum disulfide powder (59.35 g) were weighed and mixed in a glass ball mill for 3 hours, after which the mixed powder was charged into a quartz glass reaction tube, followed by sintering by the use of the following sintering apparatus under reduced pressure at 700° C. for 30 hours and then at 1000° C. for 40 hours to obtain copper chevrel phase compound, $Cu_2Mo_6S_8$.

Figure 1:
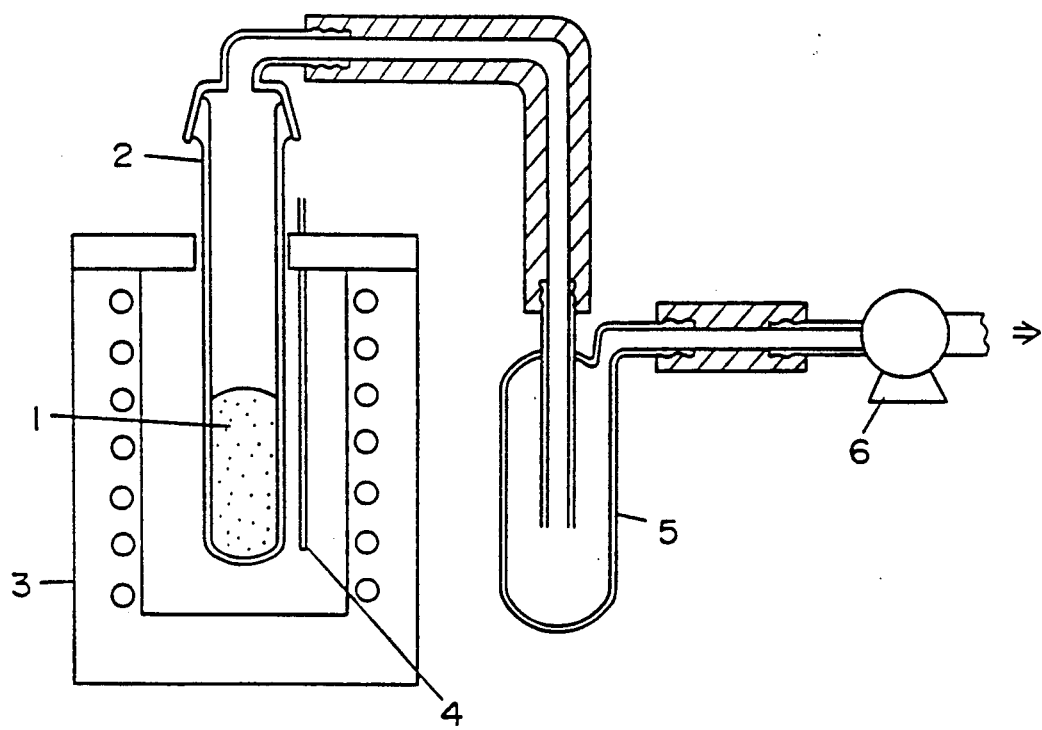
FIG. 1 is a schematic illustrative view of a sintering apparatus for manufacturing chevrel phase compounds under reduced pressure.

The sintering apparatus for manufacturing the chevrel phase compound under reduced pressure is shown in FIG. 1. In FIG. 1, indicated at 1 is a starting material, at 2 is a quartz glass reaction tube into which the starting material is charged, at 3 is an electric furnace, at 4 is a thermocouple, at 5 is a trap and at 6 is an oil rotary vacuum pump.

Figure 2:
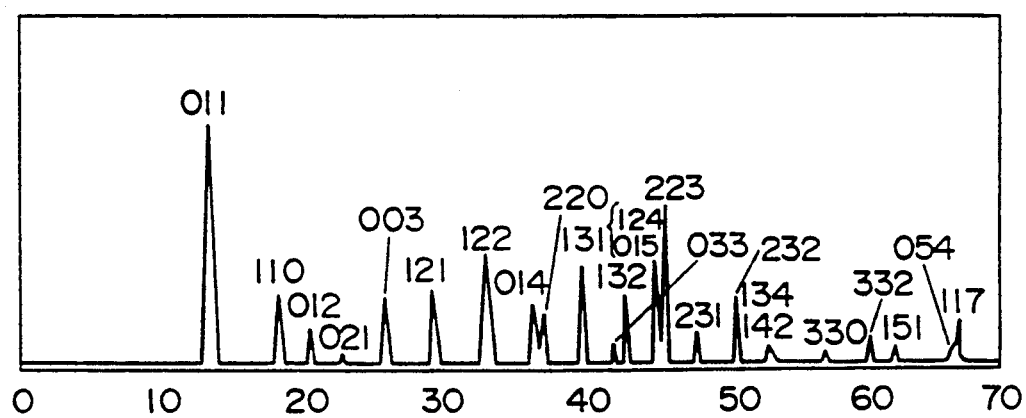
FIG. 2 is a powder X-ray diffraction pattern of a chevrel phase compound.

The thus obtained copper chevrel phase compound, $Cu_2Mo_6S_8$, was subjected to powder X-ray diffraction analysis, revealing that it consisted substantially of a single phase. In FIG. 2, there is shown a powder X-ray diffraction pattern.

With regard to the superconductivity of the copper chevrel phase compound, $Cu_2Mo_6S_8$, the critical temperature was about 10 K.

EXAMPLE 2

A nickel chevrel phase compound, $Ni_2Mo_6S_8$ (100 g) was prepared. The production procedure is described below.

In the same manner as in Example 1, nickel sulfide powder (19.12 g), metallic molybdenum (30.31 g) and molybdenum disulfide (50.57 g) were weighed and mixed in a glass ball mill for 3 hours, after which the mixed powder was charged into a quartz glass reaction tube. The mixture was sintered by the use of a sintering apparatus as used in Example 1 under reduced pressure at 700° C. for 30 hours and then at 1000° C. for 40 hours to obtain the nickel chevrel phase compound of the formula, $Ni_2Mo_6S_8$.

The thus obtained nickel chevrel phase compound, $Ni_2Mo_6S_8$, was subjected to powder X-ray diffraction analysis, with the result that a diffraction pattern similar to that of a product prepared after sealing a conventional quartz glass tube was obtained.

EXAMPLE 3

A lead chevrel phase compound, $PbMo_{6.2}S_8$, (100 g) was prepared. The production procedure is described below.

In the same manner as in Example 1, lead sulfide powder (22.60 g), metallic molybdenum powder (24.47 g) and molybdenum disulfide powder (52.93 g) were weighed and mixed by the use of a glass ball mill, after which the mixed powder was charged into a quartz glass reaction tube, followed by sintering by the use of a sintering apparatus as used in Example 1 at 700° C. for 30 hours and then at 1000° C. for 40 hours to obtain the lead chevrel phase compound, $PbMo_{6.2}S_8$.

The thus obtained lead chevrel compound, $PbMo_{6.2}S_8$, was subjected to powder X-ray diffraction analysis, revealing an X-ray diffraction pattern similar to that of a product prepared after sealing a conventional quartz glass reaction tube.

The superconductive characteristic of the lead chevrel phase compound, $PbMo_{6.2}S_8$, was such that the critical temperature was about 12 K.

EXAMPLE 4

A silver chevrel phase compound, $AgMo_6S_8$, (100 g) was prepared. The production procedure is described below.

In the same manner as in Example 1, silver sulfide powder (13.18 g), metallic molybdenum powder (22.96 g) and molybdenum disulfide powder (63.66 g) were weighed and mixed by the use of a glass ball mill, after which the mixed powder was charged into a quartz glass reaction tube, followed by sintering by the use of a sintering apparatus of the type described below in a nitrogen gas stream containing 1% of hydrogen as a reducing gas at 700° C. for 30 hours and then at 1000° C. for 40 hours to obtain the silver chevrel phase compound, $AgMo_6S_8$.

Figure 3:
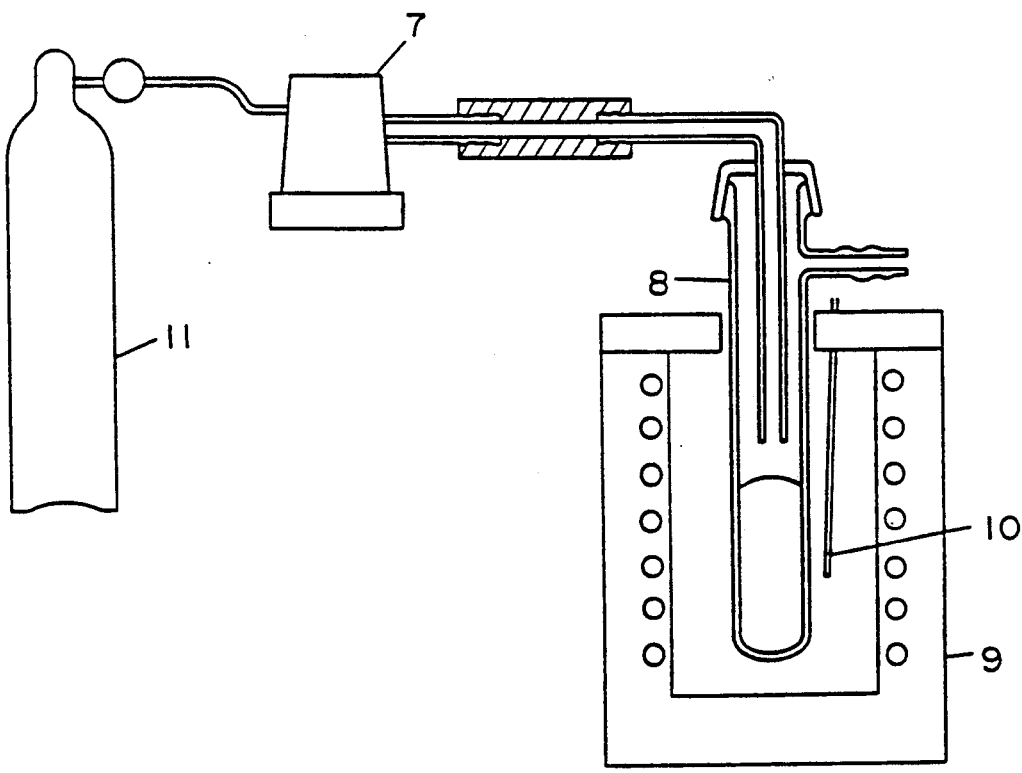
FIG. 3 is a schematic illustrative view of a sintering apparatus for manufacturing chevrel phase compounds in an inert gas stream containing hydrogen.

In FIG. 3, there is shown a schematic view of a sintering apparatus for the manufacture in an inert gas stream containing a reductive gas. In FIG. 3, indicated at 7 is a gas flow rate controlling device, at 8 is a quartz glass reaction tube, at 9 is an electric furnace, at 10 is a thermocouple, and at 11 is a nitrogen gas bomb containing 1% of hydrogen.

The thus obtained silver chevrel phase compound, $AgMo_6S_8$, was subjected to powder X-ray diffraction analysis, revealing an X-ray diffraction pattern similar to that of a product prepared after sealing a conventional quartz glass reaction tube.

The superconductive characteristic of the lead chevrel phase compound, $AgMo_6S_8$, was such that the critical temperature was about 7 K.

EXAMPLE 5

A tin chevrel phase compound, $SnMo_5S_6$, (100 g) was prepared. The production procedure is described below.

Stannous sulfide powder (19.06 g) and molybdenum sulfide powder (101.21 g) were weighed and mixed by the use of a glass ball mill, after which the mixed powder was charged into a quartz glass reaction tube, followed by sintering by the use of a sintering apparatus as used in Example 5 in a nitrogen gas stream containing 50% of hydrogen at 500° C. for 30 hours and then at 800° C. for 40 hours to obtain the tin chevrel phase compound, $SnMo_5S_6$.

The thus obtained tin chevrel phase compound, $SnMo_5S_6$, was subjected to powder X-ray diffraction analysis, revealing an X-ray diffraction pattern similar to that of a product prepared after sealing a conventional quartz glass reaction tube. The superconductive characteristic of the tin chevrel phase compound, $SnMo_5S_6$, was such that the critical temperature was about 12 K.

EXAMPLE 6

A copper chevrel phase compound, $Cu_4Mo_6S_8$, (100 g) was prepared. The production procedure is described below.

A hydrogen sulfide gas was passed into an aqueous solution dissolving copper acetate, $(CH_3CO_2)_4Cu_2.2H_2O$, thereby causing copper sulfide to precipitate. The resultant copper sulfide was filtered and washed, after which it was dried and mixed with a small amount of sulfur by the use of a glass ball mill for 3 hours, followed by treatment in a stream of hydrogen at 400° C. for 10 hours to obtain copper sulfide. This copper sulfide, metallic molybdenum powder (26.49 g) and molybdenum disulfide powder (44.20 g) were weighed and mixed by the use of a glass ball mill, after which the mixed powder was charged into a quartz glass reaction tube, followed by sintering by the use of a sintering apparatus as used in Example 5 in a stream of nitrogen gas containing 1% of hydrogen as a reducing gas at 700° C. for 30 hours and then at 1000° C. for 40 hours to obtain the copper chevrel phase compound, $Cu_4Mo_6S_8$.

The thus obtained copper compound, $Cu_4Mo_6S_8$, was subjected to powder X-ray diffraction analysis, revealing an X-ray diffraction pattern similar to that of a product prepared after sealing a conventional quartz glass reaction tube.

EXAMPLE 7

An iron chevrel phase compound, $FeMo_5S_6$, (100 g) was prepared. The production procedure is described below.

Ammonium sulfide was added to an aqueous solution dissolving ferrous chloride, $FeCl.4H_2O$, (27.31 g) thereby obtaining iron sulfide. Next, molybdenum oxide, $MoO_3$, (98.87 g) was dissolved in an aqueous ammonia solution, after which hydrogen sulfide was passed to obtain molybdenum sulfide. The thus obtained iron sulfide and molybdenum sulfide were mixed by the use of a glass ball mill for 3 hours. The mixed powder was charged into a quartz glass reaction tube and sintered by the use of a sintering apparatus as used in Example 5 in a nitrogen gas stream containing 50% of hydrogen at 500° C. for 30 hours and then at 800° C. for 40 hours, thereby obtaining the iron chevrel phase compound, $FeMo_5S_6$.

The thus obtained iron chevrel phase compound, $FeMo_5S_6$, was subjected to powder X-ray diffraction analysis, revealing an X-ray diffraction pattern similar to that of a product prepared after sealing a conventional quartz glass reaction tube.

The iron chevrel phase compound prepared according to the above procedure was found to be finer in size than those prepared from conventional starting materials such as iron sulfide, molybdenum sulfide and metallic molybdenum.

In the above examples, copper, nickel, lead, silver, tin and iron sulfides were used as metal sulfides, it will be possible to prepare chevrel phase compounds by similar procedures using other sulfides of metals such as Li, Na, Mg, Ca, Sc, Cr, Mn, Co, Zn, Sr, Y, Pd, Cd, In, Ba, La, Ce, Pr, Nd, Sm, Eu, Gd, Tb, Dy, Ho, Er, Tm, Yb and Lu.

INDUSTRIAL UTILITY

As described in detail hereinabove, chevrel phase compounds can be prepared by mixing metal sulfide powder, metallic molybdenum powder and molybdenum sulfide powder and sintering the mixture under reduced pressure or in a stream of inert gas containing a reductive gas, so that any complicated step is necessary as in prior art processes. In addition, the reactor can be re-used a desired number of times and it is possible to produce the compounds inexpensively in large amounts.

We claim:

1. A process for manufacturing Chevrel phase compounds comprising sintering a mixture of a sulfide of metal which metal is at least one element selected from Li, Na, Mg, Ca, Sc, Cr, Mn, Fe, Co, Ni, Cu, Zn, Sr, Y, Pd, Ag, Cd, In, Sn, Ba, La, Pb, Ce, Pr, Nd, Sm, Eu, Gd, Tb, Dy, Ho, Er, Tm, Yb and Lu and molybdenum sulfide in a stream of an inert gas containing a reductive gas.

2. A process for manufacturing Chevrel phase compounds according to claim 1, wherein the metal sulfide is one which is prepared from a solution containing a metal salt and wherein the metal is at least one element from Li, Na, Mg, Ca, Sc, Cr, Mn, Fe, Co, Ni, Cu, Zn, Sr, Y, Pd, Ag, Cd, In, Sn, Ba, La, Pb, Ce, Pr, Nd, Sm, Eu, Gd, Tb, Dy, Ho, Er, Tm, Yb and Lu and the molybdenum sulfide is one which is prepared from a solution containing a molybdenum salt.

* * * * *

UNITED STATES PATENT AND TRADEMARK OFFICE
CERTIFICATE OF CORRECTION

PATENT NO. : 5,089,222

DATED : February 18, 1992

INVENTOR(S) : Kondo et al

It is certified that error appears in the above-identified patent and that said Letters Patent is hereby corrected as shown below:

```
On the cover page, Field [30] should read as follows:
[30] Foreign Application Priority Data
    --October 16, 1987 [JP] Japan .......... 62-262120--
```

Signed and Sealed this

Twenty-ninth Day of June, 1993

Attest:

MICHAEL K. KIRK

*Attesting Officer*     Acting Commissioner of Patents and Trademarks